(12) United States Patent
Douglas

(10) Patent No.: US 6,545,483 B1
(45) Date of Patent: Apr. 8, 2003

(54) ANALYZER SENSOR

(75) Inventor: Phil Douglas, Clayton, NC (US)

(73) Assignee: Sensor Technologies, Inc., Durham, NC (US)

( * ) Notice: Subject to any disclaimer, the term of this patent is extended or adjusted under 35 U.S.C. 154(b) by 0 days.

(21) Appl. No.: 09/942,393

(22) Filed: Aug. 29, 2001

(51) Int. Cl.$^7$ .............................................. G01R 31/08
(52) U.S. Cl. ........................................ 324/525; 324/600
(58) Field of Search .................................. 324/525, 600

(56) References Cited

U.S. PATENT DOCUMENTS

| | | |
|---|---|---|
| 3,593,128 A | 7/1971 | Perry |
| 3,729,675 A | 4/1973 | Vosteen |
| 3,801,902 A | 4/1974 | Horowitz |
| 3,812,424 A | 5/1974 | Abbe |
| 3,852,667 A | 12/1974 | Williams et al. |
| 4,027,240 A | 5/1977 | Meade |
| 4,061,983 A | 12/1977 | Suzuki |
| 4,149,119 A | 4/1979 | Buchheit |
| 4,330,749 A | 5/1982 | Eda et al. |
| 4,370,616 A | 1/1983 | Williams |
| 4,757,252 A | 7/1988 | Maltby et al. |
| 4,766,368 A | 8/1988 | Cox |
| 4,797,620 A | 1/1989 | Williams |
| 4,801,866 A | 1/1989 | Wixley |
| 4,804,922 A | 2/1989 | Sometani et al. |
| 4,853,639 A | 8/1989 | Vosteen et al. |
| 4,868,907 A | 9/1989 | Folkins |
| 4,878,017 A | 10/1989 | Williams |
| 4,928,057 A | 5/1990 | Williams |
| 4,973,910 A | 11/1990 | Wilson |
| 4,983,907 A | 1/1991 | Crowley |
| 5,038,110 A | 8/1991 | Braun et al. |
| 5,140,614 A | 8/1992 | Buzbee et al. |
| 5,157,708 A | 10/1992 | Garthwaite et al. |
| 5,166,679 A | 11/1992 | Vranish et al. |
| 5,274,336 A | 12/1993 | Crook et al. |
| 5,297,167 A | 3/1994 | Buzbee et al. |
| 5,315,254 A | 5/1994 | Wang et al. |
| 5,363,051 A | 11/1994 | Jenstrom et al. |
| 5,436,565 A | 7/1995 | Gammell |
| 5,442,347 A | 8/1995 | Vranish |
| 5,539,292 A | 7/1996 | Vranish |
| 5,539,323 A | 7/1996 | Davis, Jr. |
| 5,703,928 A | 12/1997 | Galloway et al. |

Primary Examiner—Christine K. Oda
(74) Attorney, Agent, or Firm—Moore & Van Allen PLLC (57) ABSTRACT

An analyzer sensor for detecting signal waveforms on a pair of conductors. The apparatus includes capacitive couplers connected to termination impedance and adapted for placement adjacent to the conductors to capacitively couple the signals of the conductors to the associated termination impedance. The invention further includes a first and second buffer amplifier responsive, respectively, to the signals at the termination impedances, for providing at a first and second output thereof, respectively, an amplified difference of the signals. Furthermore, the invention includes a utility module having a battery source connected to the buffer amplifiers by a line for providing power to the buffer amplifiers at a location distant from the buffer amplifiers.

48 Claims, 8 Drawing Sheets

ANALYZER SENSOR

DESCRIPTION

1. Technical Field

The present invention relates to the field of electronic signal analyzers, and more particularly to non-contact signal analyzers for detecting the presence and transmission protocol of network signals.

2. Background Art

It is known to transmit electronic voice, video, and data signals through communications networks, such as the public switched telephone network (PSTN), the internet, and private local area and wide area networks (LANs and WANs). The network communications medium may be wireline, such as coaxial cable, twisted pair, or fiber optic cable, or wireless, such as cellular or radio frequency (RF) transmission. The majority of installed networks are wireline, and the most common type wireline is unshielded, twisted pair copper wire.

In operation, the networks provide simultaneous shared access by different users, and the signals appear in both digital and analog format; often together, such as in the PSTN where they are transmitted simultaneously in different segments of the network's frequency bandwidth. Also, the different network digital devices, such as computers, telephones, and video displays, have different signal bandwidth (bit per second) requirements. They may even have different transmission and reception signal bandwidths, as in the case of internet communications or data retrieval operations, where the download data volume far exceeds the upload commands. This is accommodated by using different digital transmission protocols, such as asymmetrical digital subscriber line (ADSL) and integrated-services digital network (ISDN), which PSTN service providers use for internet communications. In summary, a single conductor pair may simultaneously carry several full duplex signal exchanges, each at different frequency bandwidth segments, with different digital signal bandwidths, and possibly combined analog and digital format.

Networks, other than LANs, are interconnected to provide out of network communications. The interconnections are provided through the use of bridges and/or routers for the internet protocol (IP) networks, and by local and central office telephone switches for the PSTN. All of the interconnected network signal traffic flows through these switch points. Since it is necessary to monitor network signal traffic to determine performance trends or to isolate and repair failures, it is necessary for both IP network and telephone technicians to sample the network signal traffic at different locations to determine traffic patterns, but also to analyze the waveform characteristics of the transmitted signals for purposes of quality control. This quality monitoring includes the auditing of the transmission fidelity of particular digital signal protocols.

The prior art discloses various types of signal analyzers which determine the presence and transmission protocol of network signals. The manner in which these analyzers access the network signals varies. Some are invasive in that the sensor makes physical electrical contact with the conductor pairs by piercing the wire insulation with pointed probes. One such type used by telephone network technicians is referred to as a "bed of nails" in that it includes a number of fixture mounted probes which engage and make physical contact with the conductor wires. This physical contact creates signal noise which may manifest itself to the network user as audible sounds in the case of audio signal transmission or which may result in noise interference sufficient to interrupt and terminate a digital signal transmission. While audible interference may be annoying, the termination of a digital transmission and resulting loss of data may have much greater consequences.

There are also prior art non-contact sensors which inductively couple the transmission signal from the conductor pair, avoiding the problems resulting from physical connection. The inductively coupled sensors, however, also have disadvantages. One disadvantage is its limited signal sensitivity. These are current sensitive devices which are appropriate for use in detecting high current signals, but have limited use in low power signal detection such as is the case with network and telephone signals. A second disadvantage is the back electromagnetic force (emf) generated by the pick-up inductor (or coil) into the signal stream. This appears as noise on the line, which has the possibility of disrupting the signal or distorting its waveshape.

There is, therefore, a need for a signal sensor capable of acquiring for a signal analyzer, high fidelity samples of the transmitted signal waveforms on twisted pair conductors.

DISCLOSURE OF INVENTION

One object of the present invention is to provide an analyzer sensor capable of providing a signal analyzer with high fidelity waveform samples of twisted pair network signals. Another object of the present invention is to provide such a high fidelity analyzer sensor with the further characteristic of its ease of use in connecting to a twisted pair of conductors. Still another object of the present invention is to provide such an analyzer sensor with the capability of achieving a high integrity connection to a twisted pair of conductors. Still another object of the present invention is to provide such an analyzer sensor which is capable of portable use.

According to one aspect of the present invention, an analyzer sensor detects signal waveforms on a pair of conductors and provides amplification of the difference of the first and second signal waveforms. In further accord with the invention, the invention includes a first and second capacitive coupler, each connected to an associated termination impedance and each adapted for placement adjacent to a related one of the two conductors to capacitively couple first and second sample signals, respectively, of the signal waveforms from the related conductor to the associated termination impedance. In still further accord with the invention, the invention includes a first and second buffer amplifier responsive, respectively, to the first and second sample signals at the termination impedances of the first and second capacitive couplers, for providing at a first and second output thereof, respectively, an amplified difference of the first and second sample signals. Additionally, in further accord with the invention, the invention includes a utility module which includes a battery source connected to the buffer amplifiers by a line for providing power to the buffer amplifiers at a location distant from the buffer amplifiers.

According to a second aspect of the present invention, the analyzer sensor includes first and second capacitive coupler, each connected to a termination impedance and adapted for placement adjacent to a related one of the two conductors to capacitively couple first and second sample signals, respectively, of the signal waveforms from the related conductor to the associated termination impedance. In further accord with the invention, the invention includes a first and second buffer amplifier responsive, respectively, to the first and second sample signals at the termination impedances of the first and second capacitive couplers, for providing first and second conditioned signals at a first and second output thereof. In still further accord with the invention, the invention includes a third and fourth buffer amplifier including first and second inputs responsive to the first and second conditioned signals, respectively, for providing, at a third and fourth output thereof, respectively, an amplified difference of the first and second conditioned signals.

According to a third aspect of the invention, the analyzer sensor includes a housing for enclosing the capacitive couplers and buffer amplifiers. The capacitive couplers being adapted to be placed by an operator in proximity to one or more conductors. In further accord with the invention, the housing has recesses on its surface where capacitive couplers are each in registration. In still further accord with the invention, the housing includes clamp assemblies for holding each conductor in registration with the associated coupler.

According to a fourth aspect of the present invention, the battery source of the analyzer sensor includes a voltage source for supplying power to the buffer amplifiers. In further accord with the invention, the battery source includes a regulator connected to the voltage source and adapted to measure and respond to low voltage at the voltage source. In still further accord with the invention, the battery source further includes indicators connected to the regulator indicating the presence of low voltage at the voltage source.

These and other objects, features, and advantages of the present invention will become more apparent in light of the following detailed description of a best mode embodiment thereof, as illustrated in the accompanying Drawing.

BRIEF DESCRIPTION OF DRAWING

FIG. 6 is divided into FIGS. 6A, 6B, 6C and 6D for convenience.

BEST MODE FOR CARRYING OUT THE INVENTION

Figure 1:
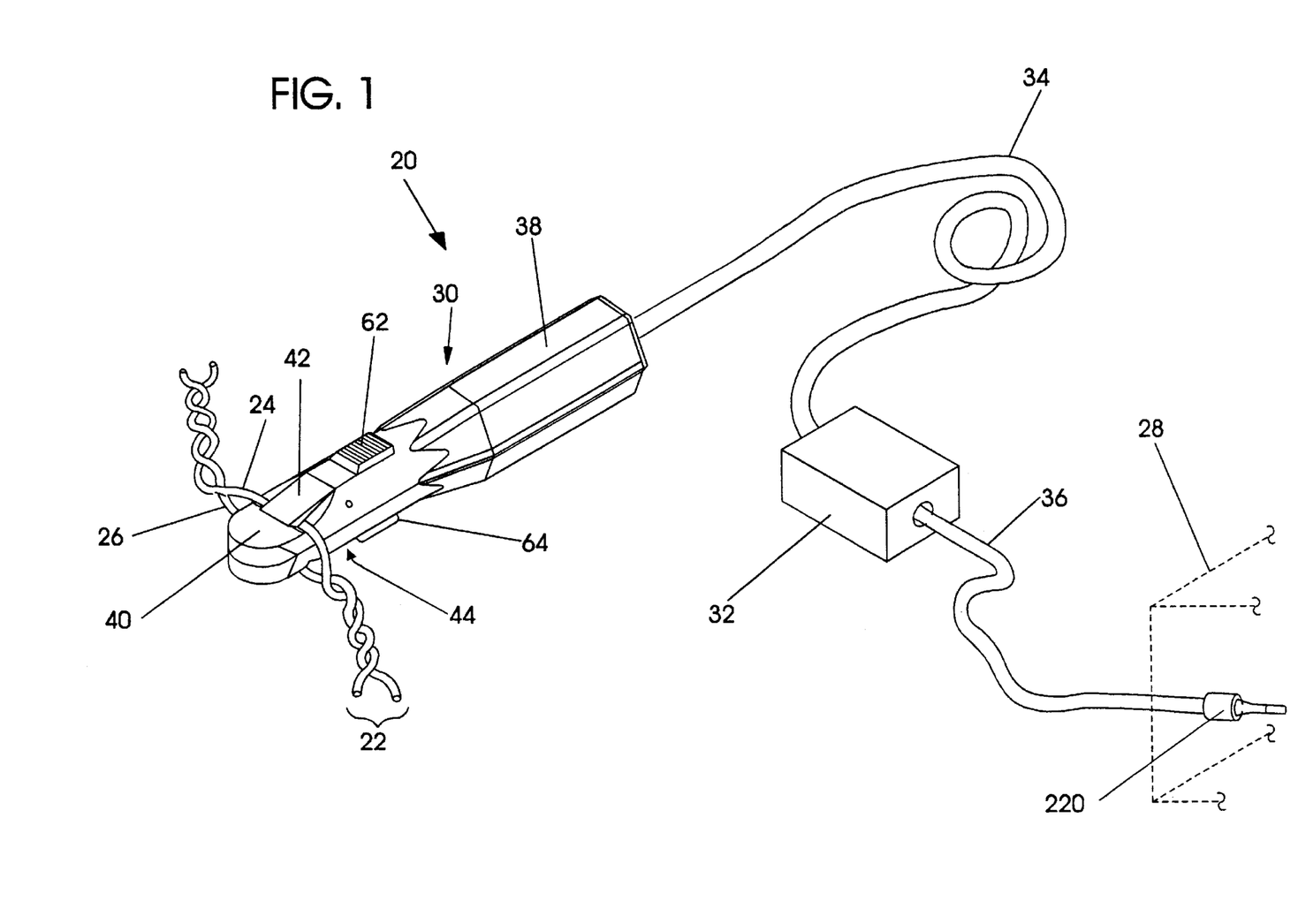
FIG. 1 is a perspective illustration of a best mode embodiment of the analyzer sensor of the present invention.

Referring to FIG. 1, the analyzer sensor 20 of the present invention uses capacitive sensors to non-invasively sample the differential digital signal protocols transmitted over twisted pair 22 signal conductors 24, 26, and accurately replicate the sampled waveforms through wide bandwidth signal conditioning circuitry prior to presentation to a signal analyzer 28 (shown in phantom). The sampled signal protocols include: T-1 signals operating from about 28 KHz to about 772 KHz, ADSL protocol signals operating at frequencies in the range of from about 25 KHz to about 1100 KHz, ISDN signals at frequencies up to about 100 KHz, and E 1 protocol signals (the European version of T-1) operating in the frequency range of about 28 KHz to about 1,024 KHz. The collective frequency range of the sampled signals is from 25KHz to 1100 KHz. The signal analyzer 28 is itself a known type, such as the Fluke Model 635 signal analyzer, or any other one of many vendor type signal analyzers known to those skilled in the art for analyzing network signal transmissions to determine signal quality and/or network performance.

In a best mode embodiment, the complete analyzer sensor 20 comprises two modules; a probe 30 and a utility module 32. The probe 30 samples the wireline signals, conditions them, amplifies them, and provides them on lines 34 to the utility module 32. The utility module 32 passes the output signals of the probe 30 to the signal analyzer and provides regulated battery power to itself and the probe 30. Additionally, the utility module 32 provides indicators to an operator of the status of the battery 222 and probe 30. This two module embodiment minimizes the sensor probe weight which in turn minimizes the weight load on the conductor pair 22. It allows the battery 222 to be connected to the circuitry inside the probe by a line for providing power to the circuitry inside the probe at a location distant from the circuitry inside the probe. It should be understood, however, that the two module embodiment is optional with the user, and that the entire sensor analyzer 20 may be enclosed within a single module.

As described with respect to FIGS. 2–5, the probe 30 capacitively couples the common mode signal transmitted on each conductor 24, 26 to replicate the differential signal waveform at the input of the probe's signal conditioning circuitry. It does this through the use of electrically conductive plates which, when placed in proximity to an associated one of the conductors 24, 26 form a capacitor. The capacitive coupling is non-invasive in that it does not violate the physical integrity of the conductors, and it neither disrupts the signal transmission nor distorts the transmitted signal waveform. The plates are terminated in an impedance and the flow of the capacitor signal current through the impedance provides a voltage signal which is a scaled replicate of the transmitted signal on the conductor.

In the preferred embodiment the sensor's conductive plates provide a surface area which is much greater than the cross sectional area of the conductors, so as to facilitate positioning of the probe 30 However, as understood by those skilled in the art it is only the plan surface of the conductive plate that is in register with the conductor that provides the capacitive coupling. The value of the coupling capacitance formed by an individual plate and its associated conductor is limited by the cross sectional area of the conductor wire that is in registration with the plate, and is on the order of less than one picofarad ($1 \times 10^{-12}$ farad) for 22–24 AWG sized wire. Therefore, if deemed necessary for a given application, the sensor's conductive plates may be reduced in size and may themselves be non-planar conductors.

Figure 2:
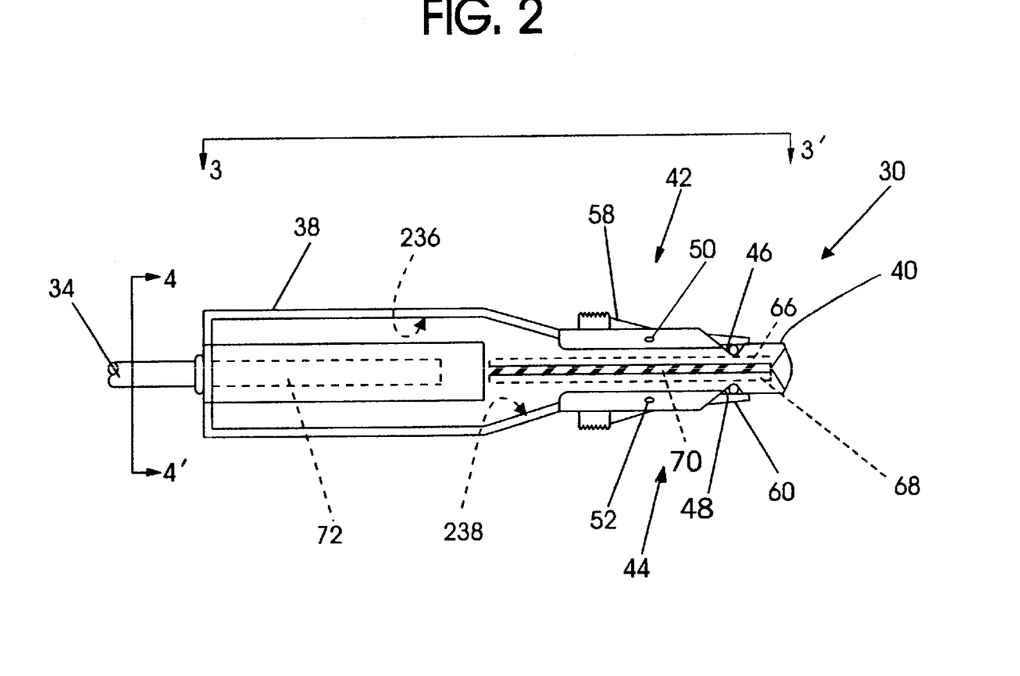
FIG. 2 is a plan view of one element of the embodiment of FIG. 1.

In addition, in the preferred embodiment of the analyzer sensor 20, the sensor probe has a housing 38 which encloses the probes electrical plates and signal conditioning circuitry in an enclosure which preferably is made of a known type, electrically non-conducting material, such as ABS Plastic. The housing 38 includes several housing features which make it highly effective for use in sensing signals on twisted pair conductors. These include a tapered, "barrel" front tip 40 capable of being readily inserted between the tightly wound conductors 24, 26 of the twisted pair 22 which, under telephone standards, may have several hundred twists per running foot. The housing also includes clamp assemblies 42, 44 which, with insertion of the barrel 40, capture and physically hold each individual conductor in place against an associated one of the probes two conductive plates, as shown in FIG. 2.

Figure 7:
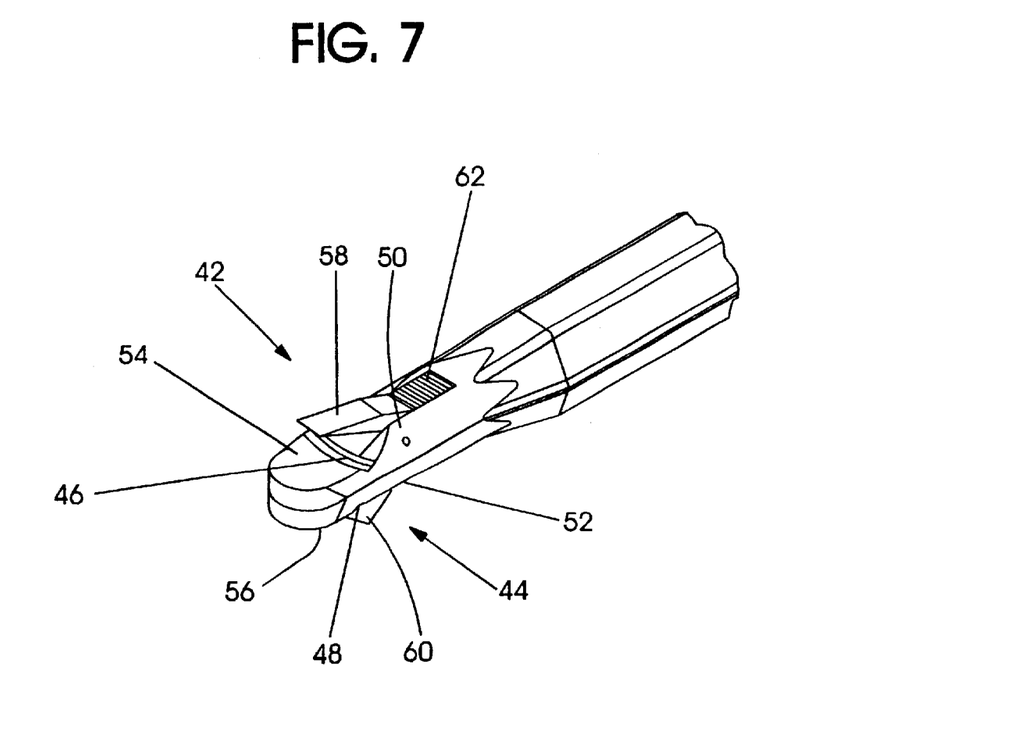
FIG. 7 is a perspective illustration highlighting an operating characteristic of the analyzer sensor embodiment of FIG. 1.

FIG. 7 illustrates the barrel portion of the probe housing 38 with the clamps 42, 44 in the open position, thereby revealing recesses 46, 48 associated with each clamp. The recesses 46, 48 are each formed by the clamp pivot mountings 50, 52 in conjunction with stubs 54, 56 associated with each clamp 42, 44. When the barrel 40 is inserted with the clamps in the open position, the conductors slide over the respective stubs 54, 56 and settle in the recesses. Closing the clamps captures the conductors within the recess; snuggly positioned against the barrel surface.

While this ensures a stable physical connection of the probe 30 to the conductors 24, 26 (FIG. 1) it also provides a substantially fixed spacing between the probe's conductive plates and the associated conductor's copper wire. As known, this spacing establishes the coupling capacitance value, which increases inversely to the distance between the plates. The present probe housing design, therefore, provides for a substantially repeatable, substantially minimal distance, providing in turn a substantially repeatable and consistent coupling capacitance value.

In the illustrated best mode embodiment the movable jaws 58, 60 of the clamps 42, 44 are spring loaded. They open with a force applied to the ends 62, 64 (FIG. 1) opposite the recesses 46, 48, and spring closed when the force is removed. It should be understood, however, that various other types and configurations of clamps may be used as deemed suitable for the particular application by those skilled in the art. For example, the jaws 58, 60 may be mechanically loaded to provide bi-stable operation in either an open, or a closed position. In this case an operator may change states simply by applying pressure on the jaws on opposite sides of the pivot mountings.

Figure 3:
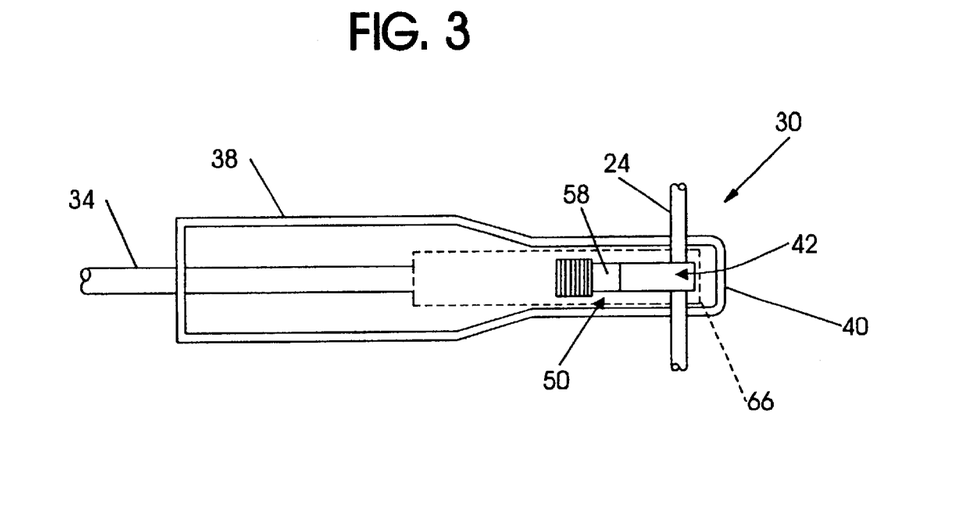
FIG. 3 is an alternate plan view of the element of FIG. 2 taken along the section line 3—3.
Figure 4:
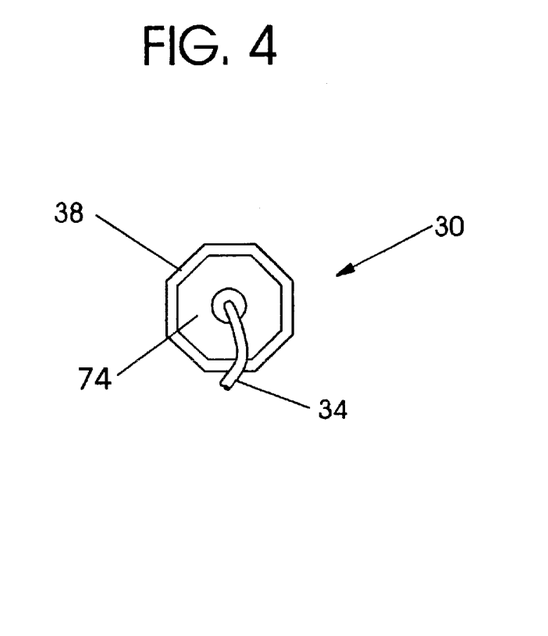
FIG. 4 is another alternate plan view of the element of FIG. 2 taken along the section line 4—4.

FIGS. 2–4 are plan views of the probe 30 taken along three different axes. The illustrations are not drawn to scale. FIG. 2 is a side elevation of the housing 38, with its barrel portion 40 and surface mounted clamp assemblies 42, 44, as well as the probe's interconnecting line 34 to the utility module 32 (FIG. 1). Also, to facilitate an understanding of the proximate location of the probe's internal elements, the sensor's conductive plates 66, 68 (shown in phantom) within the housing 38. The plates are separated by a dielectric material spacer 70 (shown in cross hatch for visual distinction). Also shown is the probe's internal circuit board 72 and its mounted components.

As may be seen, at least a portion of the surface area of the plates 66, 68 are positioned within the recesses 46, 48 of the clamp assemblies 42, 44. As shown by the cross sectioned conductors 24, 26 the plate areas are substantially larger than the conductor diameter, and extend well beyond the recesses 46, 48; along some of the length (FIG. 2) and width (FIG. 3) of the housing 38.

FIG. 3, is a plan view taken along the line 3—3 of FIG. 2, thereby illustrating the surface of the jaw 58 of the clamp assembly 42. As in FIG. 2, the internal elements are shown in phantom to again facilitate an understanding of the proximate placement of the sensor's internal elements. In the view of FIG. 3 the only internal element visible is the capacitive plate 66. FIG. 4 is a plan view taken along the line 4—4 of FIG. 2, and it illustrates a back cover 74 which seals the probe's internal elements within the housing 38.

Figure 5:
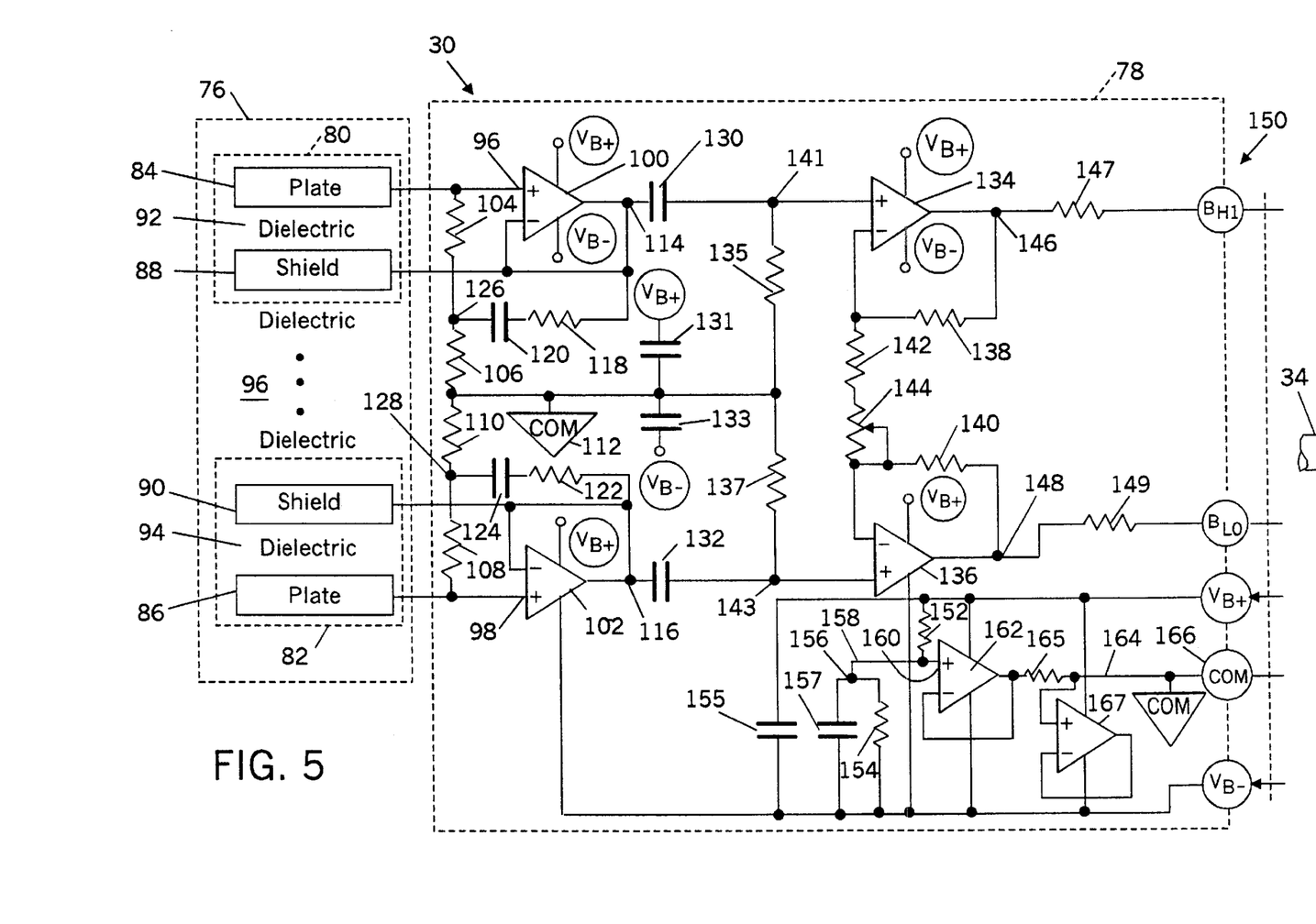
FIG. 5 is a schematic diagram of a portion of the element of FIG. 2.

FIG. 5 is a schematic illustration of the conductive plate assembly 76 and signal conditioning and amplifying circuitry 78 located within the housing 38 of the probe 30 (FIG. 1) on circuit board 72. The conductive plate assembly 76 includes capacitive couplers 80, 82, each comprising electrically conductive plates 84, 86 and associated electrically conductive shields 88, 90. The individual plates 84, 86 are spaced apart from their associated shields 88, 90 by non-conductive material layers 92, 94, such as a dielectric. As described hereinafter, in a best mode embodiment, the plates 84, 86 and shields 88, 90 are the same electrically conductive material; preferably copper. The two capacitive couplers 80, 82 are arranged within the housing such that the shields 88, 90 are adjacent each other, but separated by a layer of non-conductive material 96.

The conductive plates 84, 86 are each electrically terminated in load impedances within the signal conditioning circuitry 78. In the illustrated embodiment the terminating load impedance is equal to the input impedance of the non-inverting (+) inputs 96, 98 of operational amplifiers 100, 102, in parallel with shunt resistors 104, 106 and 108, 110; which are connected between the non-inverting (+) inputs and signal ground 112 ("COM"). The amplifiers 100, 102 are of a known type, such as the Model 8052 Operational Amplifier ("OP Amp") manufactured and sold by Analog Devices, Inc., which have a signal bandwidth of approximately 70 MHz. The broad bandwidth of this model OP Amp allows it to pass the maximum frequency protocol signals at 1100 KHz with minimum perceptible distortion. It should be understood, however, that various other known model OP Amps may be used, as may be known to those skilled in the art to have the same or higher bandwidth and common mode input impedance.

In the best mode embodiment the amplifiers 100, 102 are configured as closed loop, unity gain, voltage followers which provide, at their outputs 114, 116, a common polarity, unity gain equivalent of the respective voltages appearing on the capacitor plates 84, 86. While it is desirable to maximize the termination impedance of the conductive plates 84, 86 to maximize signal sensitivity, the high bandwidth Model 8052 operational amplifiers use bi-polar transistors which produce high bias currents at the amplifier non-inverting inputs (96, 98). The common mode input impedance of the operational amplifiers is in the range of terohms ($10^{12}$), and for all practical purposes infinite. To prevent saturation of the amplifiers it is necessary to limit the DC resistor values of the resistors 104, 106 and 108, 110 connected between signal ground 112 and the non-inverting input of the amplifiers 100, 102. Conversely, however, it is necessary to provide a high termination impedance to the capacitively coupled sample signal.

Therefore, a "bootstrapping function" is provided for each amplifier 100, 102 to provide an "apparent" higher impedance termination to ensure adequate sensed signal sensitivity, while allowing for lower impedance values resistors to be used. The bootstrapping function increases the apparent impedance of the sum series resistors 104, 106 and 108, 110 by feeding back the signal from the amplifier outputs 114, 116 through series resistor-capacitor combinations 118, 120 (for amplifier 100) and 122, 124 (for amplifier 102). This bootstrap series resistor-capacitor combination 25 provides proportional-lead feedback of the amplifier output signal to the junctions 126, 128 of the resistors 104, 106 and 108, 110, respectively. The proportional signal gain from the amplifier outputs (114, 116) to the associated junctions (118, 120) substantially equals the ratio of the resistance values: R106/R118 (for amplifier 100) and R110/R122 (for amplifier 102).

In an operating example, with the resistors 104 and 108 at 220 kiloohms, the resistors 106, 110 at 4.7 kiloohms, the resistors 118, 122 at 2.2 kiloohms, and the capacitors 120, 124 equal to 0.01 microfarad, the proportional feedback gain is 47,000/49,200, or substantially unity gain. As a result the resistors 104, 108 have substantially the same polarity, same magnitude signal at each end, resulting in a drop in resistor current by an amount proportional to the ratio of the resistors R106/R118 (for amplifier 100) and R110/R122 (for the amplifier 102), or 47,000/2,200=21.36.

The electrically conductive shields 88, 90 isolate their associated conductive plates 84, 86 from ambient radio frequency (RF) energy and other environmental electrostatic effects, thereby enhancing the probe's signal sensitivity. In the best mode embodiment the shields are electrically connected to the outputs 114, 116 of their associated operational amplifiers 100, 102. Since the output signals from the amplifiers are substantially equal in magnitude and polarity to the instant magnitude of the signal on their respective conductive plates, the effect is to maintain the shields at substantially the same voltage potential as their associated plate.

This has several benefits. The low output impedance of the operational amplifiers substantially immunizes the shields from ambient electrostatic effects, thereby maximizing their shielding of the conductive plates, and the substantially zero differential electric field between shield and plate minimizes the capacitive coupling between them. Similarly, the low impedance termination of the shields minimizes cross coupling of signals between the plates. The combined effect is to maximize the signal sensitivity of the sensor.

The sampled and conditioned common mode signals at the outputs 114, 116 of the amplifiers 100, 102 are each connected by capacitors 130, 132 to the non-inverting inputs 141, 143 of operational amplifiers 134, 136. The capacitors 130, 132 block any direct current (DC) signals that may be present. The operational amplifiers 134, 136 are Model 8052 in this embodiment. The operational amplifiers 134, 136 provide further conditioning and amplification to outputs 114, 116. Again, this model operational amplifier, Model 8052, allows it to pass maximum frequency protocol signals at 1100 KHz with minimum perceptible distortion. It should be understood, however, that various other known model operational amplifiers may be used, as known to those skilled in the art to have the same or higher bandwidth and common mode input impedance.

In the best mode embodiment, the OP Amps 134,136 are configured to provide a signal gain to the voltages appearing at the non-inverting (+) inputs. It is desirable to maximize the termination impedance of the output 141,143 to maximize signal sensitivity, and the high bandwidth Model 8052 OP Amps use bi-polar transistors which produce high bias currents at the OP Amp non-inverting inputs. To prevent saturation of the OP Amps (134, 136) resistors 135,137 provide a DC path for the bias current.

The OP Amps 134,136 are configured with resistors 138,140, and 142 and potentiometer 144 to provide amplification to the input signal at 141 and 143. The amplification is a differential gain, a gain in the difference between the two signals of the conductors 24, 26. This gain is to compensate for loss caused by the capacitive coupling of the probe 30 to the conductors 24, 26. This gain is adjustable by the potentiometer (R144). This difference gain between the two signals substantially equals the ratio of the following resistor values:

$$1 + \frac{R138 + R140}{R142 + R144}$$

In an operating example, with the resistors 138 and 140 at 10 kiloohms, resistor 142 at 500 ohms, and potentiometer 144 at 1.5 kiloohms, the difference signal gain ranges from approximately 400 to 10, depending on the setting of the potentiometer 144. At the lowest resistance setting with the potentiometer at 0 ohms, the difference signal gain is 400. At the other extreme with the potentiometer 144 at 1.5 kiloohms, the difference signal gain is 10. In this preferred embodiment, the OP Amps 134, 136 must be able to drive 6 volts peak-to-peak.

The outputs 146 and 148 are connected to resistors 147 and 149 respectively. The other terminals of resistors 147, 149 are connected to $B_{HI}$ and $B_{LO}$ respectively at connector 150. $B_{HI}$ and $B_{LO}$ signals pass through the utility module 32 to the signal analyzer 28 via lines 34 and 36. The resistors 147 and 149 are each 47 ohms in this embodiment. Resistors 147 and 149 function to match the impedance of the lines 34 and 36.

The capacitors 131, 133 connected between COM node 112 and $V_B^+$ and $V_B^-$ provide a bypass to prevent noise from distorting the signal. In this preferred embodiment, the capacitors 131, 133 are each 0.1 microfarads.

At the connector 150 the probe 30 receives at terminals marked $V_B^+$ and $V_B^-$ the regulated battery voltage signal from the utility module 32. The $V_B^+$ and $V_B^-$ signals are presented across series resistors 152, 154 which, at their junction 156 provide a nominal one-half volt-per-volt gain transfer to provide a nominal voltage magnitude of ½ ($V_B^+ + V_B^-$). In the illustrated embodiment $V_B^+$=+7.5 VDC and $V_B^-$=0 VDC, such that the nominal voltage at the junction 156 ($E_B$) is nominally +3.75 VDC. The $E_B$ voltage signal is provided on line 158 to the non-inverting input 160 of a buffer amplifier 162. In a best mode embodiment, the buffer amplifier 162 is a unity gain follower in series with a resistor 165 and an operational amplifier 167 which together provides a +$E_B$ signal at its output 164, which is connected to the COM (i.e. "common") node 112 within the probe 30, and also connected to the COM terminal 166 of the connector 150. The $E_B$ signal is, therefore, connected to the shield of lines 34 between the utility module 32 and probe 30(FIG. 1). This shield provides electrostatic shielding. Capacitor 155, 1.0 microfarad, is connected between $V_B^+$ and $V_B^-$, and capacitor 157, 0.1 microfarad, is connected between the non-inverting input 160 and $V_B^-$. Capacitors 155 and 157 function to stabilize the battery voltage signal received from the utility module 32.

Figures 6, 6C:
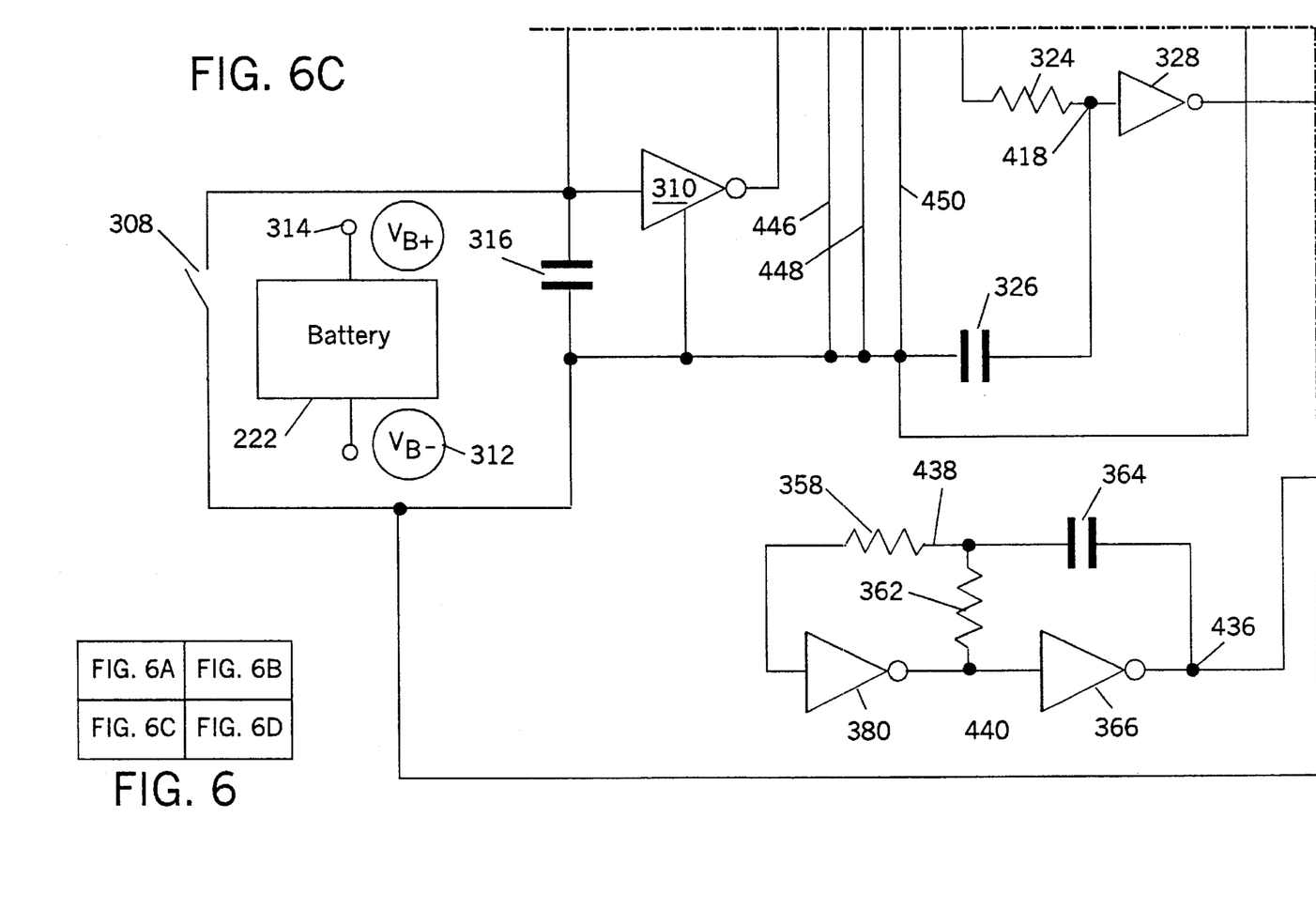
FIG. 6 is a schematic diagram of another element of the embodiment of FIG. 1.

As known and, therefore, not shown for reasons of illustrative clarity, in FIGS. 5 and 6, the individual operational amplifiers are connected at their voltage supply inputs to the supply voltage signals $V_B^+$ and $V_B^-$ at the connector 150. Since the present analyzer sensor is portable, and adapted for field use, it uses battery power as an energy source. With $V_B^+$=+7.5 VDC and $V_B^-$=0 VDC, and COM= $E_B$, or +3.75 VDC, the nominal zero signal (quiescent) voltage output of the operational amplifiers is equal to ½ of the battery voltage, 3.75 VDC. However, as understood by those skilled in the art, various other type of electrical energy sources may be used, including battery sources with different source voltage magnitudes that are within the range specified for the operational amplifiers.

Figure 6A:
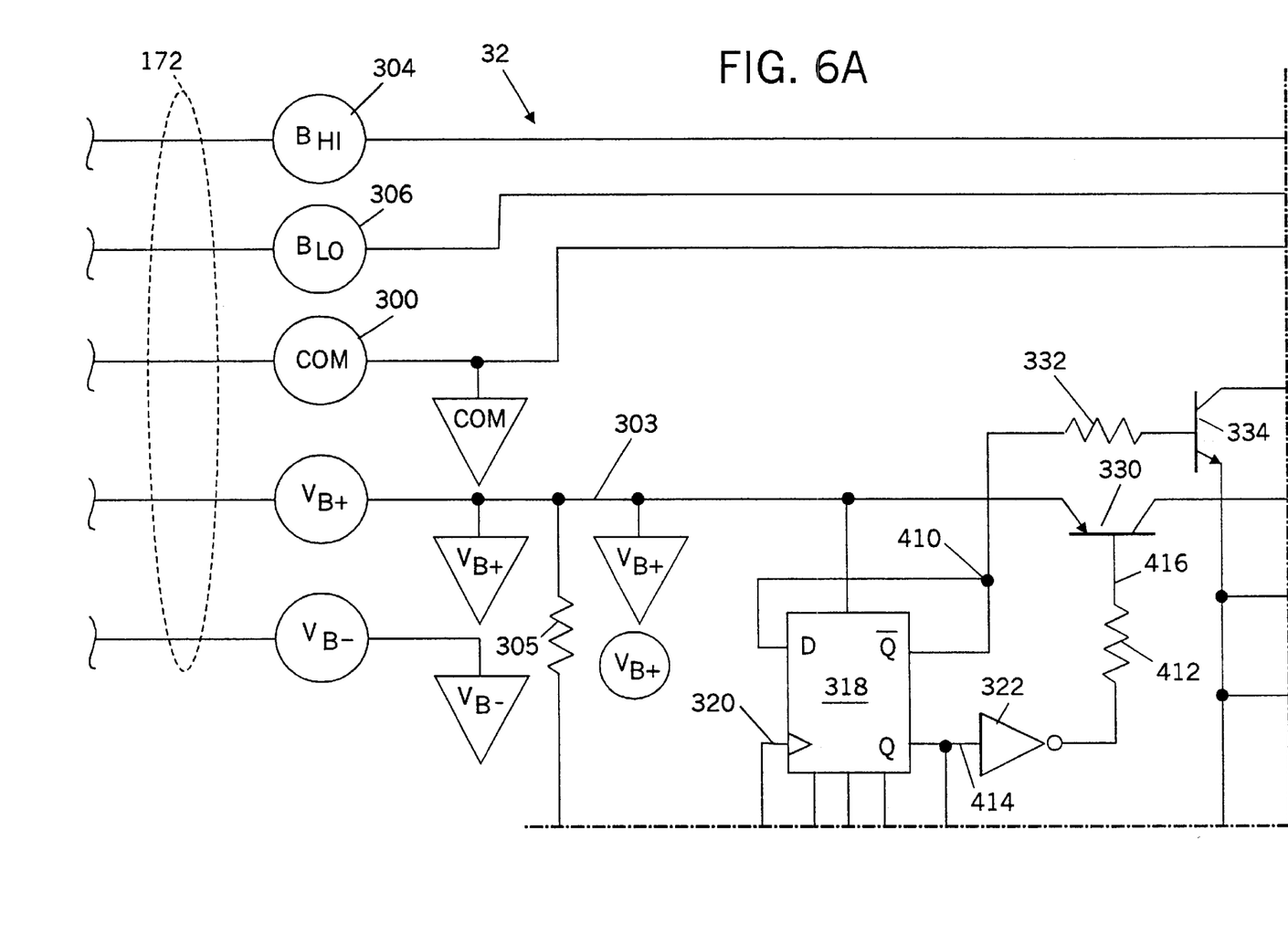
Figure 6B:
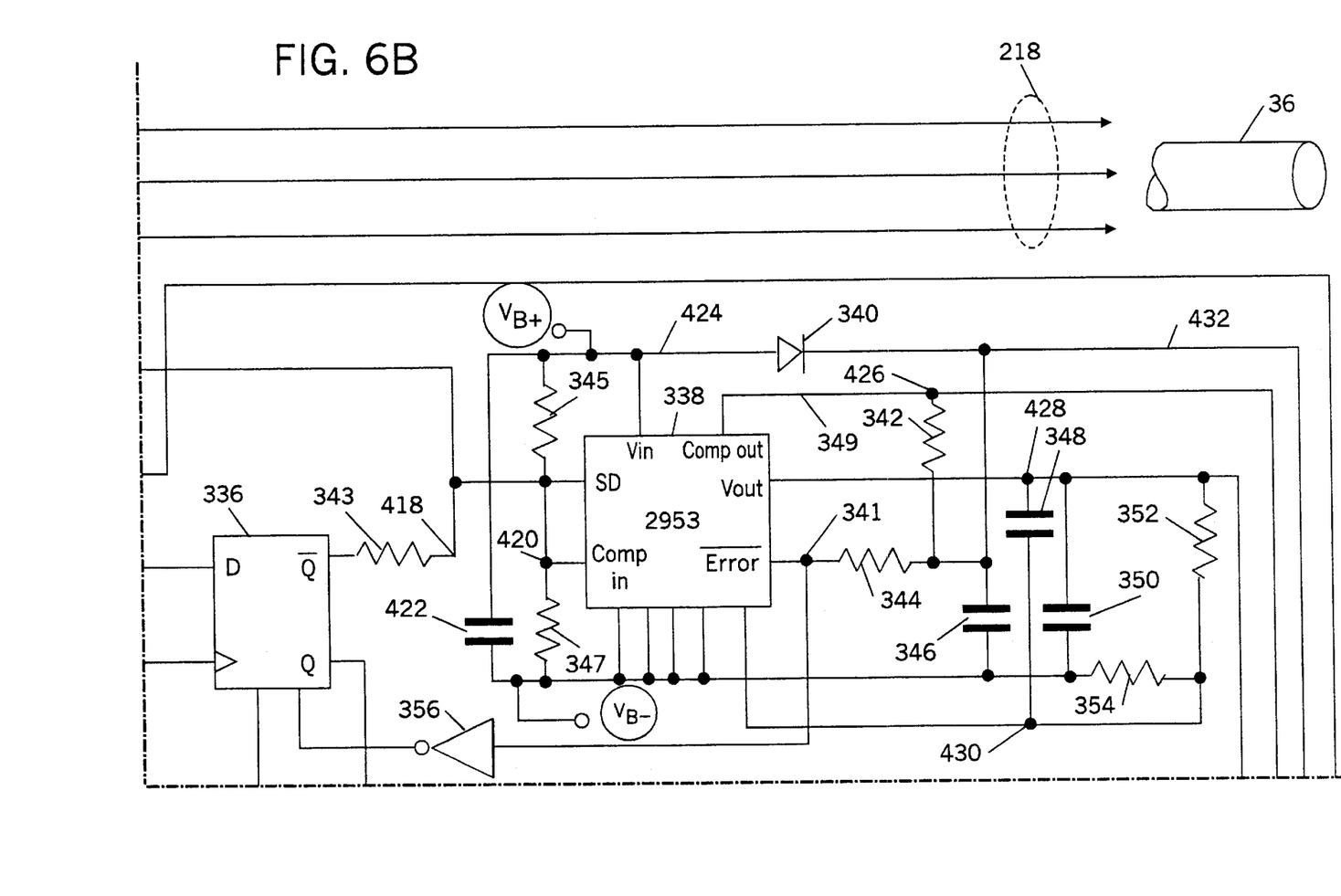
Figure 6D:
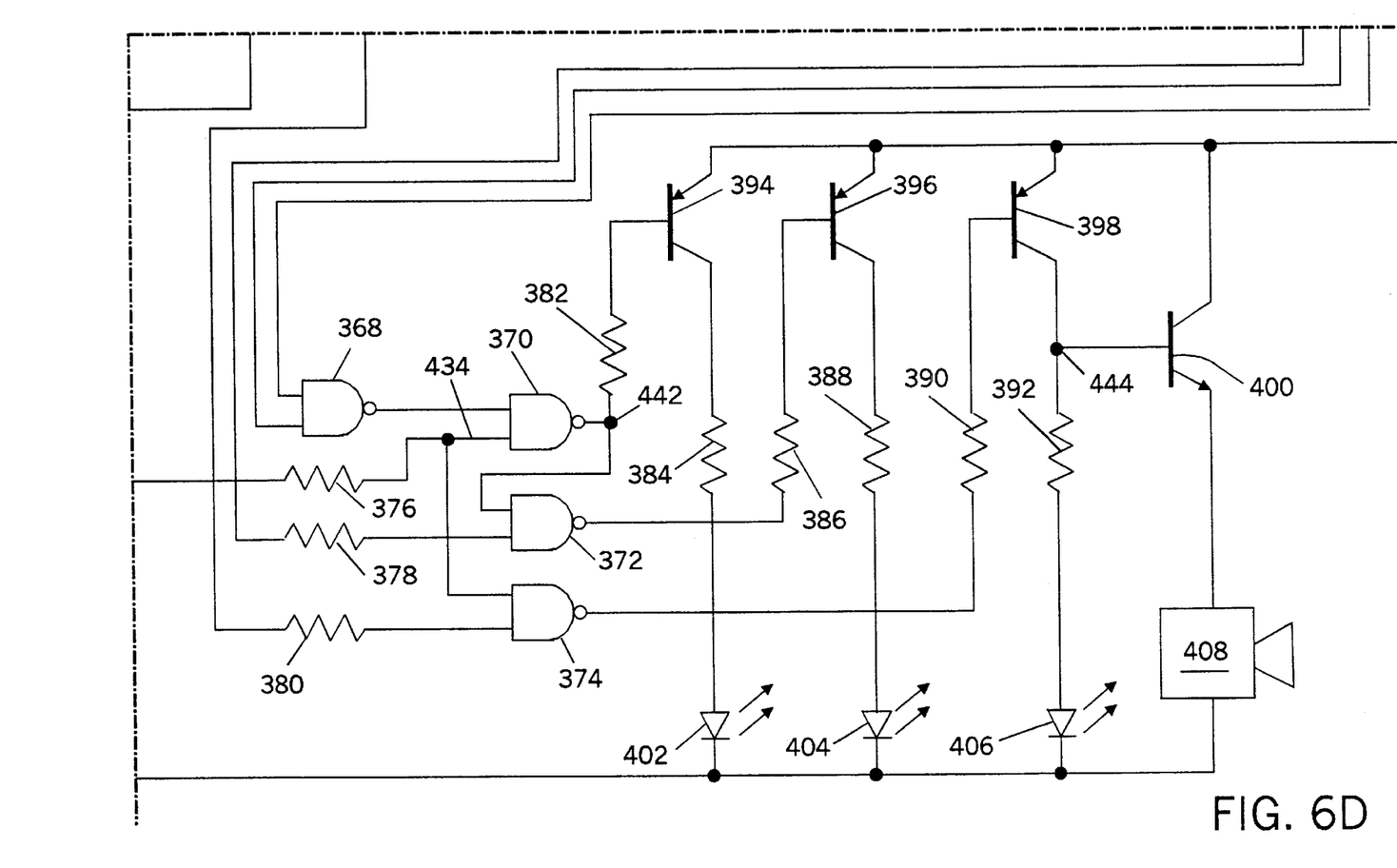

The utility module 32 functions to provide regulated power to the probe 30 and indicate to an operator when power is low. Referring now to FIG. 6, the utility module 32 receives the COM ($E_B$) signal from the line 34 at terminal 300 of the utility module connector 172 and pass through the utility module 32 to the line 36 for transmission to the signal analyzer 28. FIG. 6 is divided into FIGS. 6A, 6B, 6C and 6D for convenience. The last vertical line on FIG. 6A is the same line as the first vertical line on FIG. 6B. The last horizontal line on FIG. 6A is the same line as the first horizontal line on FIG. 6C. The last horizontal line on FIG. 6B is the same line as the first horizontal line on FIG. 6D. Signals $B_{HI}$ and $B_{LO}$ are received from the line 34 at terminals 304, 306 of the utility module connector 172 and pass through the utility module 32 to the line 36 for transmission to the signal analyzer 28. The COM ($E_B$) signal and $B_{HI}$ and $B_{LO}$ signals pass through the utility module 32 for ease of handling; however, these signals may also be separate from the utility module 32 in other embodiments.

The utility module 32 functions to manage energy from the battery 222. The battery 222 is comprised of "M" size batteries in this embodiment, which supply +9.0 DC volts. Alternatively, another known type power supply may be used. Power from the battery 222 is continuously supplied to the circuitry that monitor the state of the off-on switch 308, a momentary switch as known in the art. The circuitry continuously powered by the battery 222 are the flip-flops (318 and 336), the inverters (310, 322, 328, 356, 366, and 380), and NANDs (368, 370, 372, and 374). The regulator 338 powers the other circuitry, including the probe 30. The switch 308 is connected from $V_B^-$312, the low potential voltage of the battery 222, to the input of an inverter 310. When the switch 308 is enabled, the voltage at the input of the inverter 310 changes from high to low causing the Q output of the D flip-flop 318 to change state. When the Q output of flip-flop 318 goes high, the power on state indicating that the utility module 32 and probe 30 have been switched on, the D flip-flop 336 is turned on, and the Q output of flip-flop 336 is put in a low voltage state. Simultaneously, the inverted Q output of flip-flop 318 is in a low voltage state which allows the regulator 338 to be turned on.

The D flip-flops 318, 336 are of a known type, such as the Model 4013 D flip-flop manufactured and sold by National Semiconductor Corporation. Additionally, the inverters 310, 328, 356, 366, and 380 are of a known type, such as a CMOS-type inverter manufactured and sold by National Semiconductor Corporation.

Additionally, by causing the Q output of the D flip-flop 318 to be in a high state, power from the battery is applied to the drivers for LEDs 402, 404, and 406 and alarm 408. The alarm 408 is a sound transducer, and it is 8 ohms in this embodiment. The alarm 408 oscillates when activated as described herein below. It is activated when the output of the regulator drops to 95 percent of its nominal voltage. This signal is important because the accuracy of the measurements from the probe 30 cannot be guaranteed when the supplied power is at 95 percent.

When the Q output of the flip-flop 318 is set to a low state, the inverted output of flip-flop 336 is set at a high state. This setting turns on the regulator 338, which serves to regulate voltage. The regulator 338 provides 7.5 volts to the probe 30. The LED 404, a green LED in this embodiment, lights when the regulator 338 is on; thus, indicating the regulator 338 is on to an operator.

In order to achieve the aforementioned output for the flip-flop 318, the flip-flop 318 is configured with resistors 305, 324 and capacitors 316, 326. The resistor 305, 220 kiloohms, is connected between $V_B^-$ and the input to the inverter 310. The capacitor 316, 0.1 microfarads, is connected between the input to the inverter 310 and $V_B^-$. The resistor 305 functions to maintain a high level of voltage input from the inverter 310 until the switch 308 is activated. This high level of voltage input is desired so that the flip-flop 318 is clocked inadvertently. Additionally, the resistor 305 works in combination with the capacitor 316 to ensure that there is not bouncing of the input to the flip-flop 318 when the switch 308 is activated. The D input of flip-flop 318 is connected to the inverted Q of flip-flop 318 at juncture 410. The set, reset, and ground of flip-flop 318, indicated by 446, 448, and 450 respectively, are each connected to $V_B^-$. Q output of flip-flop 318 is connected to resistor 324, which is 1 megaohm in this embodiment, at juncture 414 and connected the input inverter 322. The output of inverter 322 is connected to resistor 412. The other terminator of resistor 412 is connected to the base of a pnp bipolar junction transistor (BJT) 330 at juncture 416. The other terminator of resistor 324 is connected to the input of inverter 328 at juncture 418. Capacitor 326 is also connected to juncture 418 at juncture 418. The other terminator of capacitor 326 is connected to $V_B^-$312. Resistor 332, 100 kiloohms, is connected to juncture 410 at one terminator and the base of npn BJT 334 at the other terminator. The emitter of BJT 330 is connected to $V_B^+$ at juncture 303. The emitter of BJT 334 is connected to the clock input and D input of flip-flop 336 and to $V_B^-$312. Output of inverter 328 is connected to reset of flip-flop 336.

The inverted Q output of flip-flop 336 is connected to a terminator of resistor 343, which is 47 kiloohms in this embodiment. The other terminator of resistor 343 is connected to the shutdown (SD) input of regulator 338 at juncture 418. The regulator 338 is of a known type, such as the Model 2953 voltage regulator manufactured and sold by National Semiconductor Corporation. The collector of BJT 334 is also connected to juncture 418. The four ground pins of the regulator 338 are each connected to $V_B^-$ for heat dissipation. The COMP input of regulator 338 is connected to resistors 345, 347 at juncture 420. The other terminator of resistor 345, 220 kiloohms in this embodiment, is connected to $V_B^+$. Capacitor 422, 1.0 microfarad in this embodiment, is connected between $V_B^+$ and $V_B^-$. The input of regulator 338 is connected to $V_B^+$ at juncture 424. Juncture 424 is connected to the anode of diode 340. The cathode of diode 340 is connected to juncture 432. COMP output of regulator 338 is connected to a terminator of resistor 342, 100 kiloohms in this embodiment, at juncture 426. The other terminator of resistor 342 is connected to resistor 344. The output of regulator 338 is connected to juncture 428, which is also connected to a terminator of each of capacitors 348, 350 and resistor 352. Capacitor 350 is 10 microfarads. Capacitor 348 is 100 picofarads. Resistor 352 is 612 kiloohms. The other terminator of capacitor 348 is connected to feedback of regulator 338 at juncture 430. Additionally, resistor 352 is connected at its other terminator to juncture 430. Resistor 354, 120 kiloohms in this embodiment, connects $V_B^-$ and juncture 430. Capacitor 346 connects to 432 and $V_B^-$.

In addition to providing regulated power to the probe 30, the regulator 338 provides battery management signals which are perceptible to operators by indicators. An error signal 341 goes active low when the regulated voltage of the battery 222 drops to 95 percent of its nominal value. When this occurs, the inverted Q output 343 of flip-flop 336 goes into a low state. This turns the regulator 338 off and removes power from the probe at $V_B^+$ and $V_B^-$. The LED 404 is also turned off at this time. When the error signal 341 is active, the red LED 406 and the alarm 408 are turned on to indicate to the user that the probe 30 is off and the regulator 338 has dropped to 95% of its nominal value.

Another management signal provided by the regulator 338 is to indicate that the battery 222 is low at a low signal 349. This function is programmed into the regulator 338 by the values of resistors 345 and 347. The resistor 345 is 220 kiloohms, and resistor 347 is 39 kiloohms. The low signal 349 becomes active when the battery 222 has approximately two hours of power remaining. When this signal goes active, the green LED 404 and yellow LED 402 are caused to blink. The blink rate is determined by the oscillator configuration of the inverters 366 and 380 described below. In this state, the regulator 338 is not turned off and the probe 30 continues to work normally.

In this embodiment, the low signal is programmed to activate at approximately 8.2 volts. At this voltage, the battery 222 used in this embodiment is expected to have approximately 2 hours of life remaining. In this configuration of resistors 345, 347 and resistor values for acquiring the desired battery voltage is given by the following equation, $$Battery\ Voltage = \frac{(R345 + R347) * 1.23}{R347}$$

The resistors 345, 347 in this embodiment achieve the desired voltage of approximately 8.2 volts.

If the switch 308 is activated while the probe 30 is operating, the power on process is reversed. That is, the regulator 338 and flip-flop 336 are turned off. In this mode, the only circuitry using battery power are the circuits that monitor the switch 308.

Logic circuitry for controlling the aforementioned battery management signals, or indicators, includes a configuration of NANDs 368, 370, 372, and 374. The indicators are the LEDs 402, 404, 406 and the alarm 408. One input to the NAND 368 is connected to juncture 432, and the other input is connected to juncture 426. The output of NAND 368 connects to an input of NAND 370. The other input of NAND 370 connects to a terminal of resistor 376, 100 kiloohms in this embodiment, at juncture 434. An input of NAND 374 connects to juncture 434. The output of NAND 370 connects to an input of NAND 372 at juncture 442. The other input of NAND 374 connects to a terminal of resistor 380, which is 100 kiloohms in this embodiment. The other terminal of resistor 380 connects to Q output of flip-flop 336.

Juncture 434 connects to a terminal of resistor 376, which is 100 kiloohms in this embodiment. The other terminal of resistor 376 connects to the output of a configuration of inverters 366, 380 at juncture 436. This configuration is the oscillator described above. This configuration produces a square wave, so as to be readily perceptible by an operator. When the LED 402 is activated it blinks at this frequency due to the oscillator. Additionally, the alarm 408 will sound off and on at this frequency when activated. Juncture 436 connects capacitor 364, 0.1 microfarads, and the output of inverter 366. The other terminator of capacitor 364 is connected to resistor 358, which is 1 megaohm, and resistor 362, which is 47.5 kiloohms in this embodiment, at juncture 438. The other terminator of resistor 358 is connected to the input of inverter 380. The output of inverter 380 is connected to the input of inverter 366 at juncture 440.

A configuration of pnp BJTs 394, 396, 398 and a npn BJT 400 are used as drivers for the LEDs (402, 404, 406) and the alarm 408. The emitters of BJTs 394, 396, 398 are connected to the collector of BJT 330. The resistor 382, which is 3.3 kiloohms in this embodiment, connects the output of NAND 370 to the base of BJT 394. The resistor 386, which is 3.3 kiloohms in this embodiment, connects the output of NAND 372 to the base of BJT 396. The resistor 390, which is 1.5 kiloohms in this embodiment, connects the output of NAND 374 to the base of BJT 398. The resistor 384, which is 1.0 kiloohm, connects the collector of BJT 394 to the anode of LED 402. The resistor 388, which is 1.0 kiloohm, connects the collector of BJT 396 to the anode of LED 404. The resistor 392, which is 1.0 kiloohm, connects the collector of BJT 398 to the anode of LED 406. The base of BJT 400 is connected to the collector of BJT 398 at juncture 444. The emitter of BJT 400 is connected to a terminal of the alarm 408. The other terminal of alarm 408 and the anodes of LEDs 402, 404, and 406 are connected to $V_B^-$.

The signals are presented through a connector 218 to the line 36 to the signal analyzer 28. The line 36 terminal connector 220 (FIG. 1) may be any one of a number of known type connectors which are known to be suitable for use with the given signal analyzer, and typically comprise the standard BANTAM model 314 type connector used in the telephone industry.

As described hereinbefore, there is a possibility of greatly varying amplitudes among the sampled transmitted signals on the twisted pair 22. Among the causes for this is the distance between the attached sensor probe and the closest network repeater transmitter, the ambient electrostatic and electromagnetic effects, and the ability to obtain optimum capacitive coupling with certain tightly twisted pair arrangements. To optimize the signal to noise ratio under these circumstances the conductive plates 84, 86 are provided with individual conductive shields 88, 90 (FIG. 5). Considering ambient noise to be the single greatest degradant of signal to noise ratio, it may be preferable to add additional active shielding to the probe 30.

Referring again to FIGS. 2–5, it is possible to provide active shielding along the inside surface of the sensor probe housing 38 (FIG. 2). In a preferred embodiment, this added active shield may take the form of segregated layers of electrically conductive material deposited along the separate regions of the housing interior, proximate to the individual electrically conductive plates 66, 68, such as for example the interior housing surfaces 236 and 238. The individual conductive surface material may then be electrically connected to the output of the associated plate buffer amplifier (100, 102, FIG. 5) or to the active shield of the related conductive plate. The conductive material layers may be provided using any of a number of known materials and employing any of a number of known methods, such as electrically conductive adhesive tape or electrically conductive polyurethane.

Although the invention has been shown and described with respect to a best mode embodiment thereof, it should be understood by those skilled in the art that various changes, omissions, and additions may be made to the form and detail of the disclosed embodiment without departing from the spirit and scope of the invention, as recited in the following claims.

I claim:

1. Apparatus for detecting signal waveforms on a pair of conductors, comprising:

a first and second capacitive coupler, each connected to an associated termination impedance and each adapted for placement adjacent to a related one of the two conductors to capacitively couple first and second sample signals, respectively, of the signal waveforms from the related conductor to the associated termination impedance;

a first and second buffer amplifier responsive, respectively, to the first and second sample signals at the termination impedances of the first and second capacitive couplers, for providing at a first and second output thereof, respectively, an amplified difference of the first and second sample signals; and a utility module including a battery source connected to the buffer amplifiers by a line for providing power to the buffer amplifiers at a location distant from the buffer amplifiers.

2. The apparatus of claim 1, wherein:

each of the capacitive couplers further include an electrically conductive shield, each conductive shield being placed in spaced apart relationship to its associated capacitive coupler;

the first and second buffer amplifiers provide the first and second equivalent sample signals at the same polarity as that of the sample signals received from their respective first and second capacitive couplers; and each conductive shield receives the equivalent sample signal from the commonly associated one of the buffer amplifiers, whereby the voltage signal potential of the conductive shield is substantially equal to the voltage signal potential of its associated capacitive coupler.

3. The apparatus of claim 2, wherein the first and second buffer amplifiers are each operational amplifiers.

4. The apparatus of claim 3, wherein each of the termination impedances associated with the first and second buffer amplifiers includes two resistors in series connected at a juncture;

each operational amplifier receives the sample signal from its associated capacitive coupler at a non-inverting signal input thereof; and each of the first and second buffer amplifiers further include a resistor and capacitor in series connected to the output of the operational amplifier at one terminator and to the juncture of the two resistors at the other terminator.

5. The apparatus of claim 1, further comprising a housing, for enclosing the capacitive couplers and the buffer amplifiers, the capacitive, couplers being adapted to be placed by an operator in proximity to one or more conductors.

6. The apparatus of claim 5, wherein the first and second capacitive couplers are each in registration with an associated one of two recesses formed on the housing surface, the recess being adapted to receive individual ones of the pair of conductors so as to place each in registration with an associated one of the capacitive couplers.

7. The apparatus of claim 6, wherein the housing further include clamp assemblies for holding each conductor in registration with the associated capacitive coupler.

8. The apparatus of claim 1, wherein each capacitive coupler is a capacitor.

9. The apparatus of claim 1, wherein the battery source is a regulated voltage source.

10. The apparatus of claim 1, wherein the battery source further includes:

a voltage source for supplying power to the buffer amplifiers; and a regulator connected to the voltage source and adapted to measure and respond to low voltage at the voltage source.

11. The apparatus of claim 10, wherein the battery source further includes indicators connected to the regulator indicating the presence of low voltage at the voltage source.

12. Apparatus for detecting signal waveforms on a pair of conductors, comprising:

a first and second capacitive coupler, each connected to an associated termination impedance and each adapted for placement adjacent to a related one of the two conductors to capacitively couple first and second sample signals, respectively, of the signal waveforms from the related conductor to the associated termination impedance;

a first and second buffer amplifier responsive, respectively, to the first and second sample signals at the termination impedances of the first and second capacitive couplers, for providing first and second conditioned signals at a first and second output thereof; and a third and fourth buffer amplifier including first and second inputs responsive to the first and second conditioned signals, respectively, for providing, at a third and fourth output thereof, respectively, an amplified difference of the first and second conditioned signals.

13. The apparatus of claim 12, wherein the first and second output of the first and second buffer amplifier are each connected to an associated second termination impedance.

14. The apparatus of claim 13, wherein:

each of the capacitive couplers further include an electrically conductive shield, each conductive shield being placed in spaced apart relationship to its associated capacitive coupler;

the first and second buffer amplifiers provide the first and second conditioned signals at the same polarity as that of the sample signals received from their respective first and second capacitive couplers; and each conductive shield receives the conditioned sample signal from the commonly associated one of the buffer amplifiers, whereby the voltage signal potential of the conductive shield is substantially equal to the voltage signal potential of its associated capacitive coupler.

15. The apparatus of claim 14, wherein the buffer amplifiers are each operational amplifiers.

16. The apparatus of claim 15, wherein:

each termination impedance associated with the capacitive coupler includes two resistors in series connected at a juncture;

each operational amplifier of the first and second buffer amplifier receives the sample signal from its associated capacitive coupler at a non-inverting signal input thereof; and each of the first and second buffer amplifier further includes a resistor and capacitor in series connected to the output of the operational amplifier at one terminator and to the juncture of the two resistors at the other terminator.

17. The apparatus of claim 13, wherein the third and fourth buffer amplifiers are each operational amplifiers.

18. The apparatus of claim 17, wherein:

each operational amplifier receives the conditioned signal from its associated first and second buffer amplifier at a non-inverting input thereof; and each operational amplifier further includes a resistor connected from the output to the inverting input.

19. The apparatus of claim 18, further comprising a resistor connected between the inverting inputs of the operational amplifiers.

20. The apparatus of claim 19, wherein the impedance of the resistor connected between the inverting inputs of the operational amplifiers is adjustable.

21. The apparatus of claim 12, further comprising a housing, for enclosing the capacitive couplers and the buffer amplifiers, the capacitive couplers being adapted be placed by an operator in proximity to one or more conductors.

22. The apparatus of claim 21, wherein the first and second capacitive couplers are each in registration with an associated one of two recesses formed on the housing surface, the recess being adapted to receive individual ones of the pair of conductors so as to place each in registration with an associated one of the capacitive couplers.

23. The apparatus of claim 22, wherein the housing further include clamp assemblies for holding each conductor in registration with the associated capacitive coupler.

24. The apparatus of claim 12, wherein each capacitive coupler is a capacitor.

25. The apparatus of claim 12, further comprising a battery source including a regulated voltage source.

26. The apparatus of claim 12, further comprising:
  a battery source, including:
    a voltage source for supplying power to buffer amplifier; and
    a regulator connected to the voltage source and adapted to measure and respond to low voltage at the voltage source.

27. The apparatus of claim 26, wherein the battery source further includes indicators connected to the regulator indicating the presence of low voltage at the voltage source.

28. Apparatus for detecting signal waveforms on a pair of conductors, comprising:
  a first and second capacitive coupler, each connected to an associated termination impedance and each adapted for placement adjacent to a related one of the two conductors to capacitively couple first and second sample signals, respectively, of the signal waveforms from the related conductor to the associated termination impedance;
  a first and second buffer amplifier responsive, respectively, to the first and second sample signals at the termination impedances of the first and second capacitive couplers, for providing first and second conditioned signals at a first and second output thereof; and
  a first and second operational amplifier, each non-inverting input connected to the first and second output of the first and second operational amplifier, respectively, each including a resistor connected between the output and the inverting input and a resistor connected between the inverting input of each operational amplifier, for providing at a third and fourth output thereof, respectively, an amplified difference of the first and second conditioned signals.

29. The apparatus of claim 28, wherein the first and second output of the first and second buffer amplifier are each connected to an associated second termination impedance.

30. The apparatus of claim 29, wherein:
  each of the capacitive couplers further include an electrically conductive shield, each conductive shield being placed in spaced apart relationship to its associated capacitive coupler;
  the first and second buffer amplifiers provide the first and second conditioned signals at the same polarity as that of the sample signals received from their respective first and second capacitive couplers; and
  each conductive shield receives the conditioned signal from the commonly associated one of the buffer amplifiers, whereby the voltage signal potential of the conductive shield is substantially equal to the voltage signal potential of its associated capacitive coupler.

31. The apparatus of claim 30, wherein the buffer amplifiers are each operational amplifiers.

32. The apparatus of claim 31, wherein:
  each termination impedance associated with the capacitive coupler includes two resistors in series connected at a juncture;
  each operational amplifier of the first and second buffer amplifier receives the sample signal from its associated capacitive coupler at a non-inverting signal input thereof; and
  each of the first and second buffer amplifiers further include a resistor and capacitor in series connected to the output of the operational amplifier at one terminator and to the juncture of the two resistors at the other terminator.

33. The apparatus of claim 28, wherein the impedance of the resistor connected between the inverting inputs of the operational amplifiers is adjustable.

34. The apparatus of claim 28, further comprising a housing, for enclosing the capacitive couplers and the buffer amplifiers, the capacitive couplers being adapted to be placed by an operator in proximity to one or more conductors.

35. The apparatus of claim 34, wherein the first and second capacitive couplers are each in registration with an associated one of two recesses formed on the housing surface, the recess being adapted to receive individual ones of the pair of conductors so as to place each in registration with an associated one of the capacitive couplers.

36. The apparatus of claim 35, wherein the housing further include clamp assemblies for holding each conductor in registration with the associated capacitive coupler.

37. The apparatus of claim 28, wherein each capacitive coupler is a capacitor.

38. The apparatus of claim 28, further comprising a battery source including a regulated voltage source.

39. The apparatus of claim 28, further comprising:
  a battery source, including:
    a voltage source for supplying power to buffer amplifier; and
    a regulator connected to the voltage source and adapted to measure and respond to low voltage at the voltage source.

40. The apparatus of claim 39, wherein the battery source further includes indicators connected to the regulator indicating the presence of low voltage at the voltage source.

41. A method of detecting signal waveforms on a pair of conductors over a full frequency spectrum, comprising:
  coupling, capacitively, each of a first and second sample signal of the transmitted signals from the conductors to a termination impedance;
  conditioning the sample signal at the termination impedance to provide a first and second equivalent sample signal;
  amplifying the difference of the first and second equivalent sample signals with buffer amplifiers; and
  powering the buffer amplifiers at a distant location.

42. The method of claim 41, wherein the step of coupling includes:
  shielding the capacitive coupling means with a conductive shield to minimize electrostatic effects on the sample signal;

applying the equivalent sample signal to the conductive shield to minimize current leakage effects on the sample signal.

43. The method of claim 42, wherein the step of conditioning includes presenting the sample signal from the termination impedance to the non-inverting input of an operational amplifier.

44. The method of claim 43, wherein the step of coupling further includes:

providing the termination impedance as two resistors in series connected in parallel with the operational amplifier common mode input impedance, from the non-inverting signal input to ground; and bootstrapping each operational amplifier by a third resistor and capacitor connected in series from the output to the juncture of the two resistors.

45. The method of claim 41, wherein the step of amplifying includes presenting each of a first and second equivalent sample signals to a non-inverting input of a first and second operational amplifier, respectively.

46. The method of claim 45, wherein the step of amplifying further includes:

providing an impedance between the inverting input of the first and second operational amplifier; and providing an impedance feedback from each of the outputs of the first and second operational amplifier its associated inverting input.

47. The method of claim 41, further comprising:

using a housing to enclose the capacitive coupling means, conditioning means, and amplifying means; and adapting the housing for placement in proximity to one or more conductors.

48. The method of claim 41, wherein the step of powering further includes:

regulating the voltage of the power supplied to the buffer amplifier; and indicating the presence of a low voltage at the voltage source to an operator.

\* \* \* \* \*

UNITED STATES PATENT AND TRADEMARK OFFICE
CERTIFICATE OF CORRECTION

PATENT NO. : 6,545,483 B1
DATED : April 8, 2003
INVENTOR(S) : Phil Douglas

It is certified that error appears in the above-identified patent and that said Letters Patent is hereby corrected as shown below:

Column 13,
Line 42, please delete "," after the word "capacitive".

Column 15,
Line 3, please insert -- to -- after the word "adapted".

Signed and Sealed this

Twenty-sixth Day of August, 2003

JAMES E. ROGAN
*Director of the United States Patent and Trademark Office*